(12) United States Patent
Inazu

(10) Patent No.: US 12,302,674 B2
(45) Date of Patent: May 13, 2025

(54) SEMICONDUCTOR LIGHT-EMITTING ELEMENT

(71) Applicant: NIKKISO CO., LTD., Tokyo (JP)

(72) Inventor: Tetsuhiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 529 days.

(21) Appl. No.: 17/374,260

(22) Filed: Jul. 13, 2021

(65) Prior Publication Data
US 2022/0336719 A1 Oct. 20, 2022

(30) Foreign Application Priority Data
Apr. 20, 2021 (JP) .................................. 2021-071234

(51) Int. Cl.
| | |
|---|---|
| *H10H 20/857* | (2025.01) |
| *H10H 20/01* | (2025.01) |
| *H10H 20/825* | (2025.01) |
| *H10H 20/831* | (2025.01) |
| *H10H 20/832* | (2025.01) |
| *H10H 20/84* | (2025.01) |
| *H10H 20/856* | (2025.01) |

(52) U.S. Cl.
CPC ........ *H10H 20/857* (2025.01); *H10H 20/831* (2025.01); *H10H 20/835* (2025.01); *H10H 20/84* (2025.01); *H10H 20/856* (2025.01); *H10H 20/032* (2025.01); *H10H 20/034* (2025.01); *H10H 20/0363* (2025.01); *H10H 20/0364* (2025.01); *H10H 20/825* (2025.01)

(58) Field of Classification Search
CPC ....... H01L 33/405; H01L 33/62; H01L 33/38; H10K 59/88; H10K 59/131; H10K 59/35
See application file for complete search history.

(56) References Cited

U.S. PATENT DOCUMENTS

2007/0262338 A1* 11/2007 Higashi ................... H01L 33/38
257/E33.057
2015/0380621 A1* 12/2015 Chae ....................... H01L 33/62
257/93

(Continued)

FOREIGN PATENT DOCUMENTS

| | | | |
|---|---|---|---|
| JP | 2019149480 A | | 9/2019 |
| KR | 2020086937 A | * | 7/2020 |

*Primary Examiner* — Syed I Gheyas
*Assistant Examiner* — Casey Paul Boatman
(74) *Attorney, Agent, or Firm* — MUNCY, GEISSLER, OLDS & LOWE, P.C.

(57) ABSTRACT

A semiconductor light-emitting element includes: an n-side contact electrode in contact with an n-type semiconductor layer; a p-side contact electrode in contact with a p-type semiconductor layer; an n-side first electrode in contact with the n-side contact electrode; a p-side first electrode in contact with the p-side contact electrode; a first insulating layer covering the n-side and p-side first electrodes; an n-side second electrode on the first insulating layer and in contact with the n-side first electrode; a p-side second electrode on the first insulating layer and in contact with the p-side first electrode; a second insulating layer covering the n-side and p-side second electrodes; an n-side pad electrode on the second insulating layer and in contact with the n-side second electrode; and a p-side pad electrode on the second insulating layer and in contact with the p-side second electrode.

8 Claims, 6 Drawing Sheets

(56) References Cited

U.S. PATENT DOCUMENTS

| | | | |
|---|---|---|---|
| 2019/0109263 A1* | 4/2019 | Lim | H10H 20/835 |
| 2019/0157504 A1* | 5/2019 | Park | H01L 33/06 |
| 2020/0203586 A1* | 6/2020 | Kimura | H05K 5/10 |
| 2020/0220046 A1* | 7/2020 | Inazu | H01L 33/32 |
| 2020/0227595 A1* | 7/2020 | Jang | H10H 20/835 |
| 2022/0310883 A1* | 9/2022 | Takeya | H01L 33/62 |

* cited by examiner

SEMICONDUCTOR LIGHT-EMITTING ELEMENT

RELATED APPLICATION

Priority is claimed to Japanese Patent Application No. 2021-071234, filed on Apr. 20, 2021, the entire content of which is incorporated herein by reference.

BACKGROUND OF THE INVENTION

1. Field of the Invention

The present invention relates to semiconductor light-emitting elements.

2. Description of the Related Art

A semiconductor light-emitting element includes an n-type semiconductor layer, an active layer, and a p-type semiconductor layer. An n-side contact electrode is provided on the n-type semiconductor layer, and a p-side contact electrode is provided on the p-type semiconductor layer. A configuration for increasing the light extraction efficiency by configuring the p-side contact electrode as an indium oxide-based transparent electrode, providing a dielectric multilayer film that covers the p-type semiconductor layer and the p-side contact electrode, and providing a first p-electrode connected to the p-side contact electrode on the dielectric multilayer film is proposed (see, e.g., JP2019-149480A).

In the case of a light-emitting element that outputs deep ultraviolet light having a wavelength of 360 nm or shorter, the deep ultraviolet light will be absorbed by the transparent electrode so that improvement of the light extraction efficiency using the transparent electrode and the dielectric multilayer film cannot be expected. Further, the transparent electrode has low sheet resistance, and its function to diffuse the current horizontally is poor. Therefore, the current injected into the p-type semiconductor layer is easily concentrated locally. An increase in the amount of injected current for the purpose of obtaining a high output easily induces an excessive current locally and leads to shortened life of the element.

SUMMARY OF THE INVENTION

The present invention addresses the above-described issue, and a purpose thereof is to provide a technology of improving the reliability of a semiconductor light-emitting element that outputs deep ultraviolet light.

A semiconductor light-emitting element according to an embodiment of the present invention includes: an n-type semiconductor layer; an active layer provided on the n-type semiconductor layer and configured to emit deep ultraviolet light having a wavelength of 360 nm or shorter; a p-type semiconductor layer provided on the active layer; an n-side contact electrode in contact with an upper surface of the n-type semiconductor layer; a p-side contact electrode in contact with an upper surface of the p-type semiconductor layer; an n-side first electrode in contact with an upper surface and a side surface of the n-side contact electrode; a p-side first electrode in contact with an upper surface and a side surface of the p-side contact electrode; a first insulating layer that has an n-side first opening provided on the n-side first electrode, has a p-side first opening provided on the p-side first electrode, covers the n-side first electrode outside the n-side first opening, covers the p-side first electrode outside the p-side first opening, and is in contact with the n-type semiconductor layer, the active layer, the p-type semiconductor layer, the n-side first electrode, and the p-side first electrode; an n-side second electrode provided on the first insulating layer and being in contact with the n-side first electrode in the n-side first opening; a p-side second electrode provided on the first insulating layer and being in contact with the p-side first electrode in the p-side first opening; a second insulating layer that has an n-side second opening provided on the n-side second electrode, has a p-side second opening provided on the p-side second electrode, covers the n-side second electrode outside the n-side second opening, covers the p-side second electrode outside the p-side second opening, and is in contact with the first insulating layer, the n-side second electrode, and the p-side second electrode; an n-side pad electrode provided on the second insulating layer and being in contact with the n-side second electrode in the n-side second opening; and a p-side pad electrode provided on the second insulating layer and being in contact with the p-side second electrode in the p-side second opening.

DETAILED DESCRIPTION OF THE INVENTION

Figure 1:
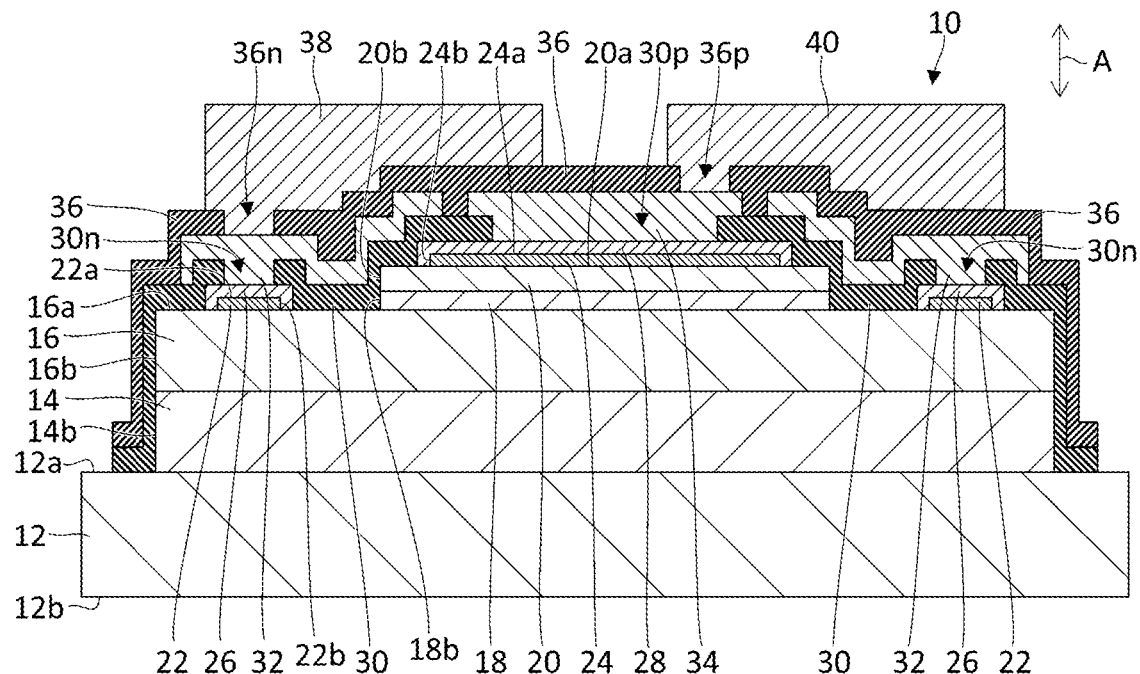
FIG. 1 is a cross sectional view schematically showing a configuration of a semiconductor light-emitting element according to the first embodiment.

The invention will now be described by reference to the preferred embodiments. This does not intend to limit the scope of the present invention, but to exemplify the invention.

A detailed description will be given of embodiments of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the actual apparatus.

The semiconductor light-emitting element according to the embodiment is configured to emit "deep ultraviolet light" having a central wavelength $\lambda$ of about 360 nm or shorter and is a so-called deep ultraviolet-light-emitting diode (DUV-LED) chip. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN.

First Embodiment

FIG. 1 is a cross sectional view schematically showing a configuration of a semiconductor light-emitting element 10 according to the embodiment. The semiconductor light-emitting element 10 includes a substrate 12, a base layer 14, an n-type semiconductor layer 16, an active layer 18, a p-type semiconductor layer 20, an n-side contact electrode 22, a p-side contact electrode 24, an n-side first electrode 26, a p-side first electrode 28, a first insulating layer 30, an n-side second electrode 32, a p-side second electrode 34, a second insulating layer 36, an n-side pad electrode 38, and a p-side pad electrode 40.

Referring to FIG. 1, the direction indicated by the arrow A may be referred to as "vertical direction" or "direction of thickness". In a view of the substrate 12, the direction away from the substrate 12 may be referred to as upward, and the direction toward the substrate 12 may be referred to as downward.

The substrate 12 includes a first principal surface 12a and a second principal surface 12b opposite to the first principal surface 12a. The first principal surface 12a is a crystal growth surface for growing the layers from the base layer 14 to the p-type semiconductor layer 20. The substrate 12 is made of a material having translucency for the deep ultraviolet light emitted by the semiconductor light-emitting element 10 and is made of, for example, a sapphire ($Al_2O_3$). The second principal surface 12b is a light extraction substrate for extracting the deep ultraviolet light emitted by the active layer 18 outside. The substrate 12 may be made of AlN or made of AlGaN.

The base layer 14 is provided on the first principal surface 12a of the substrate 12. The base layer 14 is a foundation layer (template layer) to form the n-type semiconductor layer 16. The base layer 14 is made of an undoped AlGaN-based semiconductor material and includes, for example, an undoped AlN layer and an undoped AlGaN layer provided on the AlN layer. The base layer 14 may be comprised only of an undoped AlGaN layer when the substrate 12 is an AlN substrate or an AlGaN substrate.

The n-type semiconductor layer 16 is provided on the base layer 14. The n-type semiconductor layer 16 is made of an n-type AlGaN-based semiconductor material layer and is doped with, for example, Si as an n-type impurity. The n-type semiconductor layer 16 is made of, for example, n-type AlGaN having an AlN composition of 25% or higher, 40% or higher, or 50% or higher. The n-type semiconductor layer 16 is made of, for example, n-type AlGaN having an AlN composition of 80% or lower or 70% or lower. The n-type semiconductor layer 16 has, for example, a thickness equal to or more than 1 μm and equal to or less than 3 μm.

The active layer 18 is provided on the n-type semiconductor layer 16. The active layer 18 has a monolayer or multilayer quantum well structure. The active layer 18 includes a well layer made of an undoped AlGaN-based semiconductor material and a barrier layer made of an undoped AlGaN-based semiconductor material. The active layer 18 may have a multiple quantum well structure in which a plurality of well layers and a plurality of barrier layers are alternately stacked. The active layer 18 may further include an electron blocking layer provided on the quantum well structure.

The p-type semiconductor layer 20 is provided on the active layer 18. The p-type semiconductor layer 20 is made of a p-type AlGaN-based semiconductor material and is doped with magnesium (Mg) as a p-type impurity. The p-type semiconductor layer 20 has a thickness equal to or more than 50 nm and equal to or less than 300 nm. The p-type semiconductor layer 20 may include a plurality of p-type AlGaN semiconductor layers having different AlN compositions. The p-type semiconductor layer 20 may include, for example, a first p-type semiconductor layer having an AlN composition of 40% or higher and a second p-type semiconductor layer provided on the first p-type semiconductor layer and having an AlN composition of 20% or lower. The second p-type semiconductor layer may be a p-type GaN layer made of p-type GaN having an AlN composition of 0%.

The n-side contact electrode 22 is provided on an upper surface 16a of the n-type semiconductor layer 16 and is in contact with the upper surface 16a of the n-type semiconductor layer 16. The n-side contact electrode 22 is in ohmic contact with the n-type semiconductor layer 16. For example, the n-side contact electrode 22 includes a Ti layer in contact with the n-type semiconductor layer 16 and an Al layer provided on the Ti layer. The n-side contact electrode 22 may further include a Ti layer, an Ni layer, an Rh layer, an Au layer, etc. provided on the Al layer and may have a Ti/Al/Ti/Au stack structure.

The p-side contact electrode 24 is provided on an upper surface 20a of the p-type semiconductor layer 20 and is in contact with the upper surface 20a of the p-type semiconductor layer 20. The p-side contact electrode 24 is in ohmic contact with the p-type semiconductor layer 20. For example, the p-side contact electrode 24 includes an Ni layer in contact with the p-type semiconductor layer 20 and an Au layer provided on the Ni layer. The p-side contact electrode 24 may include an Rh layer or a Cr layer in contact with the p-type semiconductor layer 20 and an Al layer provided on the Rh layer or the Cr layer. The p-side contact electrode 24 may have an Rh/Al or Cr/Al stack structure. The p-side contact electrode 24 may further include a Ti layer, an Ni layer, a Rh layer, an Au layer, etc. provided on the Al layer and may have an Rh/Al/Ti/Au or Cr/Al/Ti/Au stack structure.

The n-side first electrode 26 is in contact with an upper surface 22a and a side surface 22b of the n-side contact electrode 22 and covers the n-side contact electrode 22. The n-side first electrode 26 is in contact with the upper surface 16a of the n-type semiconductor layer 16. The n-side first electrode 26 is a metal multilayer film in which a plurality of metal layers made of different metal materials are stacked. The thickness of the n-side first electrode 26 is equal to or more than 500 nm and equal to or less than 1500 nm and is, for example, equal to or more than 700 nm and equal to or less than 1200 nm.

The p-side first electrode 28 is in contact with an upper surface 24a and a side surface 24b of the p-side contact electrode 24 and covers the p-side contact electrode 24. The p-side first electrode 28 is in contact with the upper surface 20a of the p-type semiconductor layer 20. The p-side first electrode 28 is a metal multilayer film configured in the same manner as the n-side first electrode 26. The thickness of the p-side first electrode 28 is equal to the thickness of the n-side first electrode 26. The thickness of the p-side first electrode 28 is equal to or more than 500 nm and equal to or less than 1500 nm and is, for example, equal to or more than 700 nm and equal to or less than 1200 nm.

The first insulating layer 30 has an n-side first opening 30n provided on the n-side first electrode 26, has a p-side first opening 30p provided on the p-side first electrode 28, covers the n-side first electrode 26 outside the n-side first opening 30n, and covers the p-side first electrode 28 outside the p-side first opening 30p. The n-side first opening 30n has an opening area smaller than the area of the upper surface of the n-side first electrode 26, and the p-side first opening 30p has an opening area smaller than the area of the upper surface of the p-side first electrode 28. The first insulating layer 30 is in contact with the upper surface and the side surface of the n-side first electrode 26 and is in contact with the upper surface and the side surface of the p-side first electrode 28. The first insulating layer 30 is in contact with the upper surface 16a of the n-type semiconductor layer 16, a side surface 18b of the active layer 18, and the upper surface 20a and a side surface 20b of the p-type semiconductor layer 20. The first insulating layer 30 may be in contact with a side surface 16b of the n-type semiconductor layer 16, may be in contact with a side surface 14b of the base layer 14, and may be in contact with the first principal surface 12a of the substrate 12.

The first insulating layer 30 is made of a dielectric material transparent to deep ultraviolet light. The first insulating layer 30 is made of a single dielectric material and is made of, for example, silicon oxide ($SiO_2$) or aluminum oxide ($Al_2O_3$). It is preferred that the thickness of the first insulating layer 30 be equal to or larger than the thickness of the n-side first electrode 26 and the p-side first electrode 28. The thickness of the first insulating layer 30 is equal to or more than 500 nm and equal to or less than 2000 nm and is, for example, equal to or more than 700 nm and equal to or less than 1500 nm.

The n-side second electrode 32 is provided on the first insulating layer 30 so as to block the n-side first opening 30n and is in contact with the n-side first electrode 26 in the n-side first opening 30n. The n-side second electrode 32 is provided in a range more extensive than a range in which the n-side first electrode 26 is formed. The n-side second electrode 32 is provided to cover the side surface 18b of the active layer 18 and is provided to overlap the active layer 18. The n-side second electrode 32 may be provided to overlap the p-side first electrode 28. In this case, the first insulating layer 30 insulates the n-side second electrode 32 and the p-side first electrode 28 electrically.

The n-side second electrode 32 is a metal multilayer film in which a plurality of metal layers made of different metal materials are stacked. The thickness of the n-side second electrode 32 is equal to or more than 500 nm and equal to or less than 1500 nm and is, for example, equal to or more than 700 nm and equal to or less than 1200 nm. The thickness of the n-side second electrode 32 may be equal to the thickness of the n-side first electrode 26 and the p-side first electrode 28 or may be larger than the thickness of the n-side first electrode 26 and the p-side first electrode 28. The thickness of the n-side second electrode 32 may be equal to the thickness of the first insulating layer 30 or may be larger than the thickness of the first insulating layer 30.

The p-side second electrode 34 is provided on the first insulating layer 30 so as to block the p-side first opening 30p and is in contact with the p-side first electrode 28 in the p-side first opening 30p. The p-side second electrode 34 is provided in a range less extensive than a range in which the p-side first electrode 28 is formed. The p-side second electrode 34 is a metal multilayer film configured in the same manner as the n-side second electrode 32. The thickness of the p-side second electrode 34 is equal to the thickness of the n-side second electrode 32. The thickness of the p-side second electrode 34 is equal to or more than 500 nm and equal to or less than 1500 nm and is, for example, equal to or more than 700 nm and equal to or less than 1200 nm.

The second insulating layer 36 has an n-side second opening 36n provided on the n-side second electrode 32, has a p-side second opening 36p provided on the p-side second electrode 34, covers the n-side second electrode 32 outside the n-side second opening 36n, and covers the p-side second electrode 34 outside the p-side second opening 36p. The n-side second opening 36n has an opening area smaller than the area of the upper surface of the n-side second electrode 32, and the p-side second opening 36p has an opening area smaller than the area of the upper surface of the p-side second electrode 34. The n-side second opening 36n is provided at a position that overlaps the n-side first electrode 26. The p-side second opening 36p is provided at a position that overlaps the active layer 18. The second insulating layer 36 is in contact with the first insulating layer 30, the n-side second electrode 32 and the p-side second electrode 34. The second insulating layer 36 is stacked to cover the first insulating layer 30 above the first principal surface 12a of the substrate 12, the side surface 14b of the base layer 14, and the side surface 16b of the n-type semiconductor layer 16. When the first insulating layer 30 does not cover the first principal surface 12a of the substrate 12 or the side surface 16b of the n-type semiconductor layer 16, the second insulating layer 36 may cover the first principal surface 12a of the substrate 12 or the side surface 16b of the n-type semiconductor layer 16 so as to be directly in contact therewith.

The second insulating layer 36 is made of a single dielectric material and is made of the same material as the first insulating layer 30. For example, the second insulating layer 36 is made of, for example, silicon oxide ($SiO_2$) or aluminum oxide ($Al_2O_3$). It is preferred that the thickness of the second insulating layer 36 be equal to or larger than the thickness of the n-side second electrode 32 and the p-side second electrode 34. The thickness of the second insulating layer 36 is equal to or more than 500 nm and equal to or less than 2000 nm and is, for example, equal to or more than 800 nm and equal to or less than 1500 nm.

The n-side pad electrode 38 is provided on the second insulating layer 36 so as to block the n-side second opening 36n and is in contact with the n-side second electrode 32 in the n-side second opening 36n. The n-side pad electrode 38 is provided at, for example, a position that overlaps the n-side contact electrode 22 and the active layer 18. The n-side pad electrode 38 is a metal multilayer film in which a plurality of metal layers made of different metal materials are stacked. The thickness of the n-side pad electrode 38 is equal to or more than 1 μm and equal to or less than 10 μm and is, for example, equal to or more than 2 μm and equal to or less than 5 μm. The thickness of the n-side pad electrode 38 is larger than the thickness of the second insulating layer 36.

The p-side pad electrode 40 is provided on the second insulating layer 36 so as to block the p-side second opening 36p and is in contact with the p-side second electrode 34 in the p-side second opening 36p. The p-side pad electrode 40 is provided at, for example, a position that overlaps the n-side contact electrode 22 and the active layer 18. The p-side pad electrode 40 is a metal multilayer film configured in the same manner as the n-side pad electrode 38. The thickness of the p-side pad electrode 40 is equal to the thickness of the n-side pad electrode 38. The thickness of the p-side pad electrode 40 is equal to or more than 1 μm and equal to or less than 10 μm and is, for example, equal to or more than 2 μm and equal to or less than 5 μm.

Figure 2:
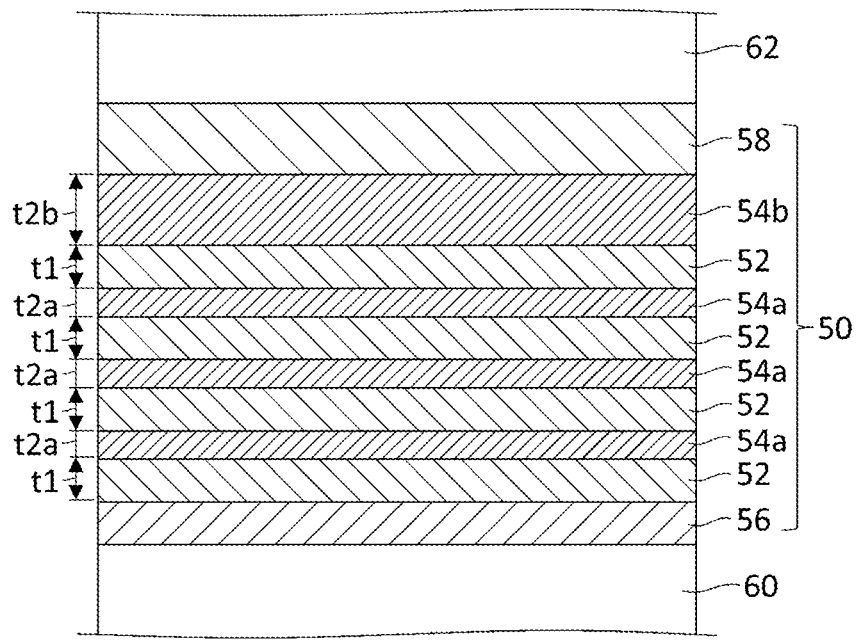
FIG. 2 is a cross-sectional view showing a configuration of a metal multilayer film.

FIG. 2 is a cross-sectional view showing a configuration of a metal multilayer film 50. The metal multilayer film 50 can be used in each of the n-side first electrode 26, the p-side first electrode 28, the n-side second electrode 32, and the p-side second electrode 34. The metal multilayer film 50 includes a plurality of first metal layers 52, a plurality of second metal layers 54a, 54b, a third metal layer 56, and a fourth metal layer 58.

The plurality of first metal layers 52 are made of a first metal material and are Ti layers made of Ti or Cr layers made of Cr. The plurality of second metal layers 54a, 54b are made of a second metal material different from the first metal material and are, for example, Rh layers made of Rh, Ta layers made of Ta, or Ni layers made of Ni. The conductivity of the second metal material is higher than the conductivity of the first metal material. The plurality of second metal layers 54a, 54b are stacked alternately with the plurality of first metal layers 52. In the example of FIG. 2, four first metal layers 52 and four second metal layers 54a, 54b are stacked alternately. Each of the number of first metal layers 52 and the number of second metal layers 54a, 54b may be 3 or smaller or 5 or larger.

The thicknesses t1 of the plurality of first metal layers 52 are substantially equal and configured such that the variation in thickness is less than 10%. The thickness t1 of each of the plurality of first metal layers 52 is equal to or more than 50 nm and equal to or less than 200 nm and is, for example, equal to or more than 80 nm and equal to or less than 150 nm.

The thicknesses t2a, t2b of the plurality of second metal layers 54a, 54b are substantially equal except for the topmost second metal layer 54b. In other words, the thicknesses t2a of the plurality of second metal layers 54a except for the topmost layer are substantially equal and configured such that the variation in thickness is less than 10%. The thickness t2a of the plurality of second metal layers 54a except for the topmost layer is smaller than the thickness t1 of the first metal layer 52 and is equal to or more than 40 nm and equal to or less than 150 nm and is, for example, equal to or more than 60 nm and equal to or less than 120 nm.

The topmost second metal layer 54b is provided on the plurality of first metal layers 52. In other words, the first metal layer 52 is not located on the topmost second metal layer 54b. The thickness t2b of the topmost second metal layer 54b is larger than the thickness t2a of the plurality of second metal layers 54a except for the topmost layer and is equal to or more than 50 nm and equal to or less than 300 nm and is, for example, equal to or more than 80 nm and equal to or less than 200 nm. The thickness t2b of the topmost second metal layer 54b may be equal to the thickness t1 of the first metal layer 52, smaller than the thickness t1 of the first metal layer 52, or larger than the thickness t1 of the first metal layer 52.

The third metal layer 56 is provided below the alternate stack structure of the plurality of first metal layers 52 and the plurality of second metal layers 54a, 54b. The third metal layer 56 may be the lowermost layer of the metal multilayer film 50 or a layer in contact with a lower layer 60 provided below the metal multilayer film 50. The third metal layer 56 is made of a third metal material having a higher reflectivity for deep ultraviolet light than the first metal material and the second metal material and is, for example, an Al layer made of Al. The thickness of the third metal layer 56 is equal to or more than 50 nm and equal to or less than 200 nm and is, for example, equal to or more than 80 nm and equal to or less than 150 nm.

The fourth metal layer 58 is provided above the alternate stack structure of the plurality of first metal layers 52 and the plurality of second metal layers 54a, 54b. The fourth metal layer 58 may be the topmost layer of the metal multilayer film 50 or a layer in contact with an upper layer 62 provided above the metal multilayer film 50. The fourth metal layer 58 is made of a fourth metal material having a higher conductivity than the first metal material and the second metal material and is, for example, an Au layer made of Au. The thickness of the fourth metal layer 58 is equal to or more than 100 nm and equal to or less than 500 nm and is, for example, equal to or more than 150 nm and equal to or less than 300 nm.

The metal multilayer film 50 may not include all of the first metal layers 52, the second metal layers 54a, 54b, the third metal layer 56, and the fourth metal layer 58 and may include only some of these metal layers. For example, the metal multilayer film 50 may not include the fourth metal layer 58. The metal multilayer film 50 may further include an additional metal layer different from the first metal layers 52, the second metal layers 54a, 54b, the third metal layer 56, and the fourth metal layer 58. For example, the metal multilayer film 50 may further include an adhesion layer for enhancing the adhesiveness between the fourth metal layer 58 and the upper layer 62. For example, a Ti layer may be used as the adhesion layer.

By stacking the plurality of first metal layers 52 and the plurality of second metal layers 54a, 54b alternately in the metal multilayer film 50, it is possible to increase the thickness of the metal multilayer film 50 and realize a structure in which exfoliation occurs less easily than when a single metal material is used to form a thick layer. By increasing the thickness of the metal multilayer film 50, it is possible to disperse a high electrical current traveling toward the n-side contact electrode 22 and the p-side contact electrode 24 and inhibit local current concentration. Further, by configuring the thicknesses t1 of the plurality of first metal layers 52 to be substantially equal and configuring the thicknesses t2 of the plurality of second metal layers 54a except for the topmost layer to be substantially equal, exfoliation of the layers can be inhibited.

By configuring the thickness t2b of the topmost second metal layer 54b to be large, the quality of the metal multilayer film 50 can be improved. The metal multilayer film 50 can be heated when the upper layer 62 (e.g., the first insulating layer 30 or the second insulating layer 36) is formed after the metal multilayer film 50 is formed. When the metal multilayer film 50 includes the fourth metal layer 58, metal materials may be mixed with each other at the interface between the topmost second metal layer 54b and the fourth metal layer 58 with the result that the fourth metal material (e.g., Au) may be mixed in the topmost second metal layer 54b. In this case, diffusion of the fourth metal material to the first metal layer 52, the second metal layer 54a and the third metal layer 56 can be inhibited by configuring the thickness t2b of the topmost second metal layer 54b to be relatively large. This reduces an impact of changes in the state of the upper surface of the topmost second metal layer 54b and reduction in the adhesiveness to the upper layer 62, which results from the first metal material being mixed in the topmost second metal layer 54b when the metal multilayer film 50 does not include the fourth metal layer 58.

By providing the third metal layer 56 made of the third metal material having a high reflectivity for deep ultraviolet light, the metal multilayer film 50 can be used as a reflection electrode. When the metal multilayer film 50 is used in the n-side first electrode 26 or the p-side first electrode 28, the n-type semiconductor layer 16 or the p-type semiconductor layer 20 will be the lower layer 60. By reflecting the deep ultraviolet light entering the third metal layer 56 from the lower layer 60 with a high reflectivity, the proportion of the deep ultraviolet light absorbed by the metal multilayer film 50 and lost accordingly can be reduced, and the light extraction efficiency can be increased. When the metal multilayer film 50 is used in the n-side second electrode 32 or the p-side second electrode 34, the first insulating layer 30 will be the lower layer 60. Since the first insulating layer 30 is made of a dielectric material transparent to deep ultraviolet light, the light extraction efficiency can be increased by reflecting the deep ultraviolet light transmitted through the first insulating layer 30 and entering the n-side second electrode 32 or the p-side second electrode 34 with a high reflectivity.

By causing the n-side first electrode 26 to cover the upper surface 22a and the side surface 22b of the n-side contact electrode 22, it is possible to cause a current to flow evenly over the entirety of the n-side contact electrode 22 and inhibit the current from being concentrated locally in the n-side contact electrode 22. Similarly, by causing the p-side first electrode 28 to cover the upper surface 24a and the side surface 24b of the p-side contact electrode 24, it is possible to cause a current to flow evenly over the entirety of the p-side contact electrode 24 and inhibit the current from being concentrated locally in the p-side contact electrode 24. Further, by using the metal multilayer film 50 as the n-side first electrode 26 and the p-side first electrode 28, the advantage of diffusing the current can be further enhanced. Consequently, this inhibits the element life from being shortened due to current concentration and improves the reliability of the semiconductor light-emitting element 10.

By causing the n-side first electrode 26 to cover the upper surface 22a and the side surface 22b of the n-side contact electrode 22 in the semiconductor light-emitting element 10, the coverage performance of the first insulating layer 30 can be improved as compared with a case in which the n-side first electrode 26 is provided only on the upper surface 22a of the n-side contact electrode 22. Since the first insulating layer 30 is in contact with only the n-side first electrode 26, the coverage performance of the first insulating layer 30 can be improved as compared with a case in which the first insulating layer 30 is in contact with both the n-side contact electrode 22 and the n-side first electrode 26. Similarly, by causing the p-side first electrode 28 to cover the upper surface 24a and the side surface 24b of the p-side contact electrode 24, the coverage performance of the first insulating layer 30 can be improved as compared with a case in which the p-side first electrode 28 is provided only on the upper surface 24a of the p-side contact electrode 24.

By providing the n-side second electrode 32 and the p-side second electrode 34 between the first insulating layer 30 and the second insulating layer 36, the advantage of diffusing the current can be further enhanced as compared with a case in which the n-side second electrode 32 and the p-side second electrode 34 cannot be provided. Further, by using the metal multilayer film 50 as the n-side second electrode 32 and the p-side second electrode 34, the advantage of diffusing the current can be further enhanced.

By causing the n-side second electrode 32 to cover the side surface 18b of the active layer 18, the deep ultraviolet light emitted from the side surface 18b of the active layer 18 and transmitted through the first insulating layer 30 can be reflected by the n-side second electrode 32, and the light extraction efficiency of the semiconductor light-emitting element 10 can be increased. Further, this enlarges the range in which the n-side second electrode 32 is formed and enhances the advantage of diffusing the current injected into the n-side contact electrode 22. Consequently, this inhibits the element life from being shortened due to current concentration and improves the reliability of the semiconductor light-emitting element 10.

By providing the n-side second electrode 32 and the p-side second electrode 34 on the first insulating layer 30 and providing the second insulating layer 36 on the n-side second electrode 32 and the p-side second electrode 34, the quality of sealing of the semiconductor light-emitting element 10 can be enhanced. Stated otherwise, the quality of sealing can be enhanced by a dual structure based on a dielectric material and comprised of a combination of the first insulating layer 30 and the second insulating layer 36. The quality of sealing can be enhanced by interposing a metal layer between the first insulating layer 30 and the second insulating layer 36. This can enhance the humidity resistance of the semiconductor light-emitting element 10 and improve the reliability of the semiconductor light-emitting element 10.

Figure 3:
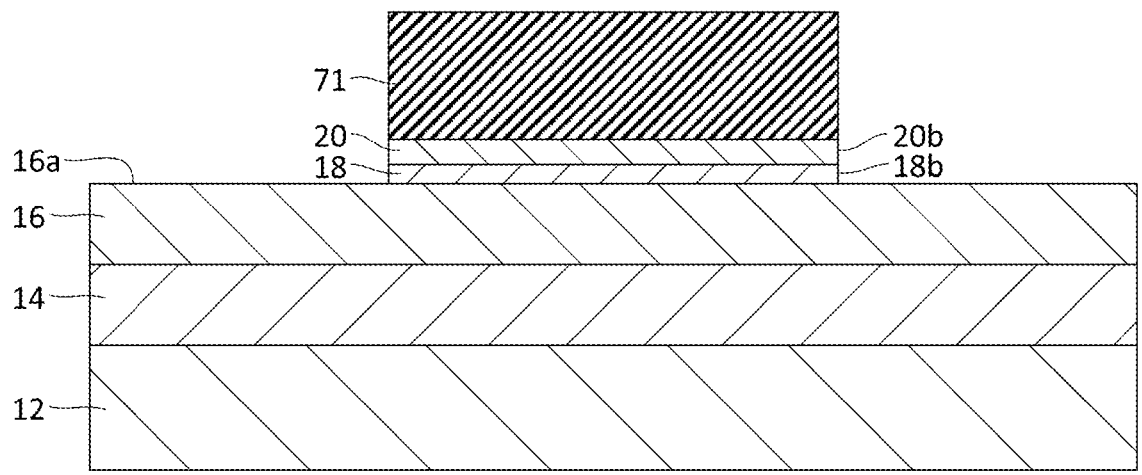
FIG. 3 schematically shows a step of manufacturing the semiconductor light-emitting element.

A description will now be given of a method of manufacturing the semiconductor light-emitting element 10. FIGS. 3-10 schematically show steps of manufacturing the semiconductor light-emitting element 10. Referring to FIG. 3, the base layer 14, the n-type semiconductor layer 16, the active layer 18, and the p-type semiconductor layer 20 are formed on the first principal surface 12a of the substrate 12 successively. The base layer 14, the n-type semiconductor layer 16, the active layer 18, and the p-type semiconductor layer 20 can be formed by a well-known epitaxial growth method such as the metal organic vapor phase epitaxy (MOVPE) method and the molecular beam epitaxy (MBE) method.

Subsequently, as shown in FIG. 3, a mask 71 is formed on the p-type semiconductor layer 20 by using a publicly known lithographic technology. After the mask 71 is formed, the p-type semiconductor layer 20 and the active layer 18 in a region not overlapping the mask 71 are removed by dry-etching or the like to expose the upper surface 16a of the n-type semiconductor layer 16 in the region not overlapping the mask 71. This etching step forms the side surface 20b of the p-type semiconductor layer 20 and the side surface 18b of the active layer 18. The mask 71 is then removed.

Figure 4:
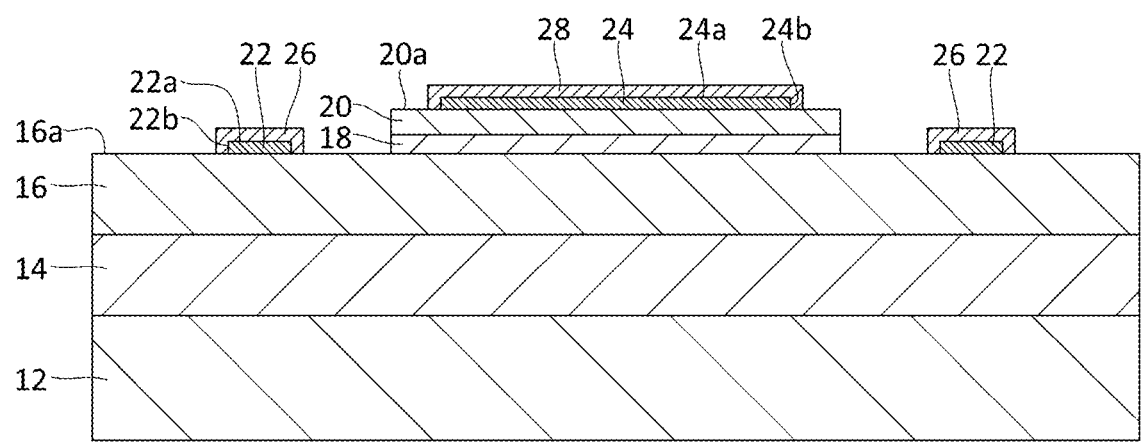
FIG. 4 schematically shows a step of manufacturing the semiconductor light-emitting element.

Subsequently, as shown in FIG. 4, the n-side contact electrode 22 is formed on the upper surface 16a of the n-type semiconductor layer 16. The n-side contact electrode 22 is annealed once it is formed. Further, the p-side contact electrode 24 is formed on the upper surface 20a of the p-type semiconductor layer 20, and the p-side contact electrode 24 is annealed once it is formed. The n-side contact electrode 22 and the p-side contact electrode 24 can be formed by sputtering or EB deposition. The sequence of forming the n-side contact electrode 22 and the p-side contact electrode 24 is not limited to any pattern. The p-side contact electrode 24 may be formed after the n-side contact electrode 22 is formed, or the n-side contact electrode 22 may be formed after the p-side contact electrode 24 is formed.

Subsequently, as shown in FIG. 4, the n-side first electrode 26 is formed to cover the upper surface 22a and the side surface 22b of the n-side contact electrode 22, and the p-side first electrode 28 is formed to cover the upper surface 24a and the side surface 24b of the p-side contact electrode 24. The n-side first electrode 26 and the p-side first electrode 28 may be formed concurrently or formed separately. The n-side first electrode 26 and the p-side first electrode 28 can be formed by sputtering or EB deposition.

Figure 5:
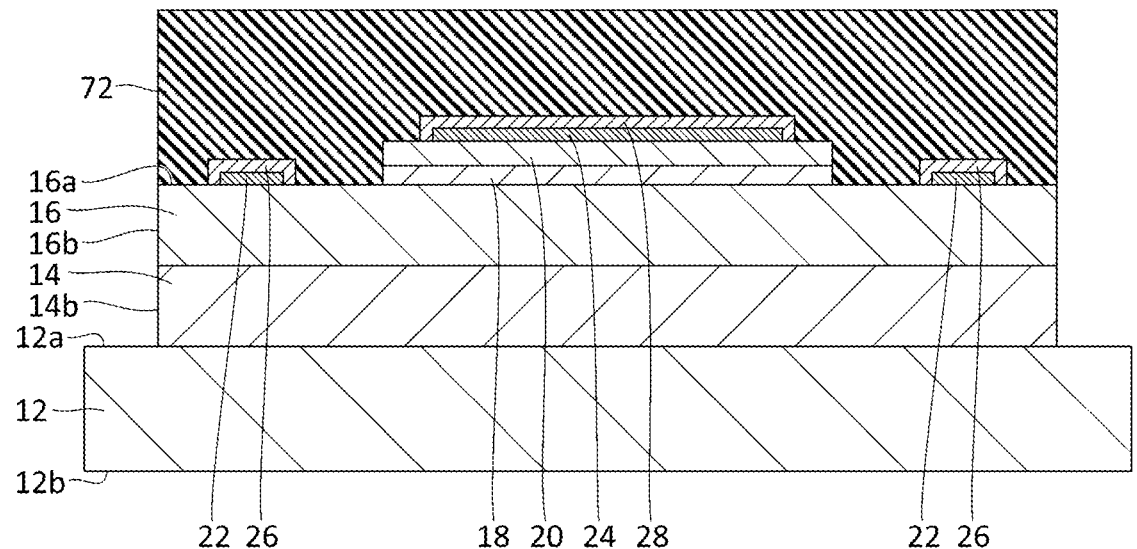
FIG. 5 schematically shows a step of manufacturing the semiconductor light-emitting element.

Subsequently, as shown in FIG. 5, a mask 72 is formed on the upper surface 16a of the n-type semiconductor layer 16 by using a publicly known lithographic technology. The mask 72 is formed to cover the active layer 18, the p-type semiconductor layer 20, the n-side first electrode 26, and the p-side first electrode 28. After the mask 72 is formed, the n-type semiconductor layer 16 and the base layer 14 in a region not overlapping the mask 72 are removed by dry-etching or the like to expose the first principal surface 12a of the substrate 12 in the region not overlapping the mask 72. This etching step forms the side surface 16b of the n-type semiconductor layer 16 and the side surface 14b of the base layer 14. The mask 72 is then removed.

Figure 6:
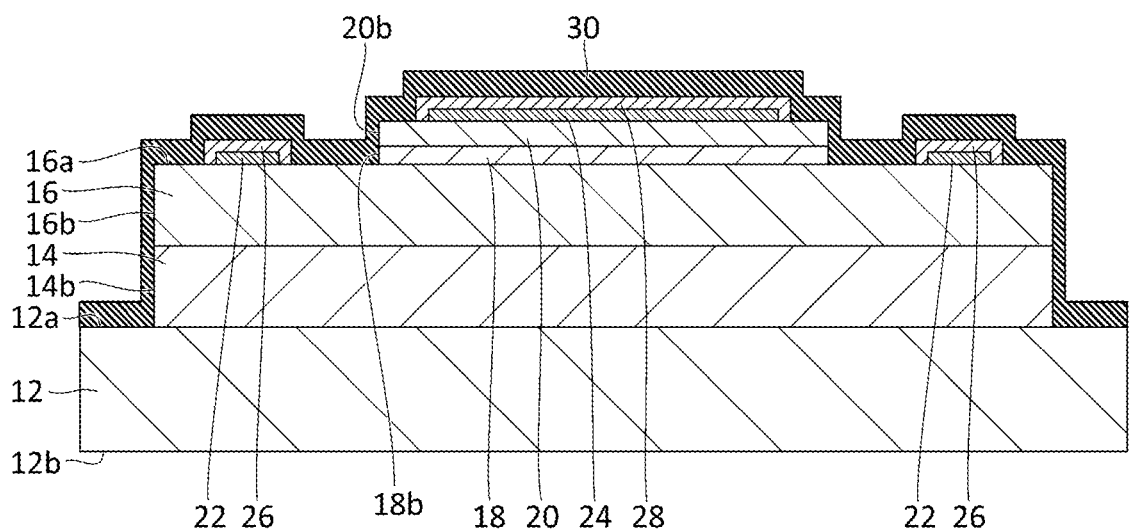
FIG. 6 schematically shows a step of manufacturing the semiconductor light-emitting element.

Subsequently, as shown in FIG. 6, the first insulating layer 30 is formed to cover the entirety of the top of the element. The first insulating layer 30 is provided to cover and be in contact with the first principal surface 12a of substrate 12, the side surface 14b of the base layer 14, the upper surface 16a and the side surface 16b of the n-type semiconductor layer 16, the upper surface and the side surface of the n-side first electrode 26, and the upper surface and the side surface of the p-side first electrode 28. The first insulating layer 30 can be formed by a well-known technology such as chemical vapor deposition (CVD).

Figure 7:
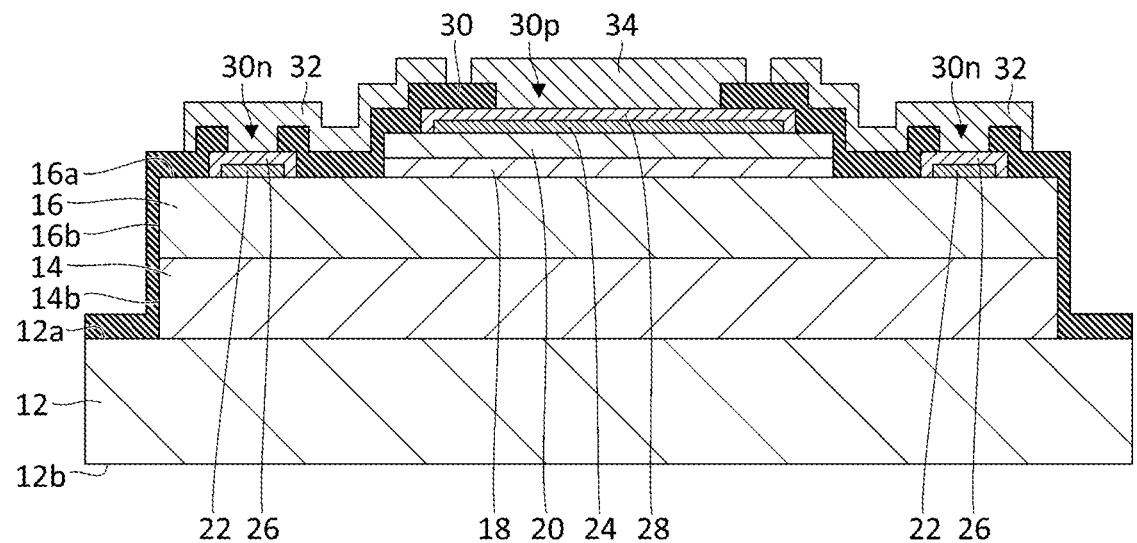
FIG. 7 schematically shows a step of manufacturing the semiconductor light-emitting element.

Subsequently, as shown in FIG. 7, the first insulating layer 30 is removed in part by dry-etching or the like to form the n-side first opening 30n and the p-side first opening 30p. The n-side first opening 30n and the p-side first opening 30p are provided to extend through the first insulating layer 30. The upper surface of the n-side first electrode 26 is exposed in the n-side first opening 30n, and the upper surface of the p-side first electrode 28 is exposed in the p-side first opening 30p.

Subsequently, as shown in FIG. 7, the n-side second electrode 32 is formed on the first insulating layer 30 so as to block the n-side first opening 30n, and the p-side second electrode 34 is formed on the first insulating layer 30 so as to block the p-side first opening 30p. The n-side second electrode 32 and the p-side second electrode 34 may be formed concurrently or formed separately. The n-side second electrode 32 and the p-side second electrode 34 can be formed by sputtering or EB deposition.

Figure 8:
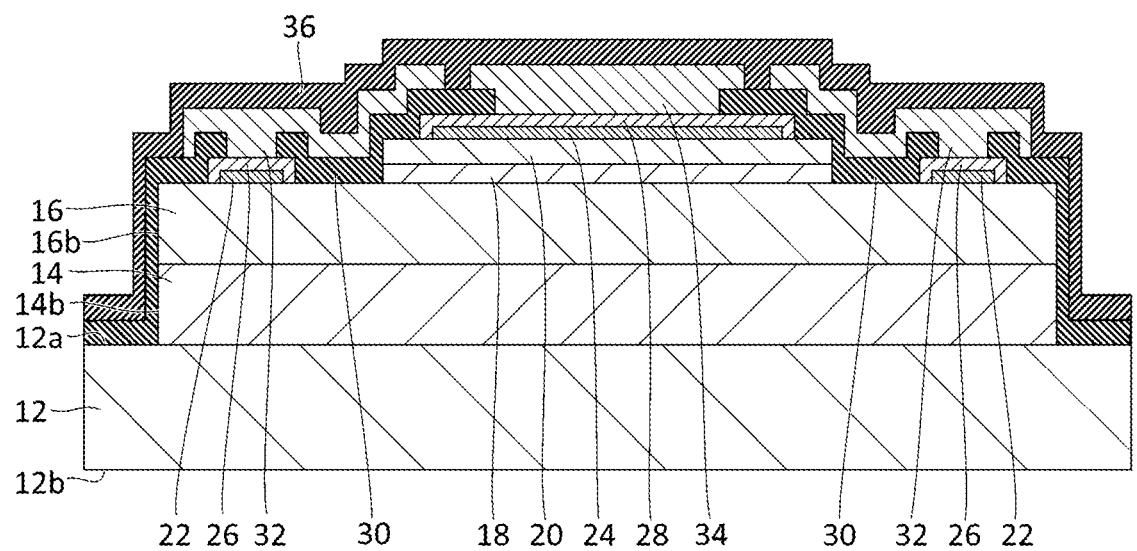
FIG. 8 schematically shows a step of manufacturing the semiconductor light-emitting element.

Subsequently, as shown in FIG. 8, the second insulating layer 36 is formed to cover the entirety of the top of the element. The second insulating layer 36 is provided to cover and be in contact with the first insulating layer 30, the n-side second electrode 32 and the p-side second electrode 34. The second insulating layer 36 can be formed by a well-known technology such as chemical vapor deposition (CVD).

Figure 9:
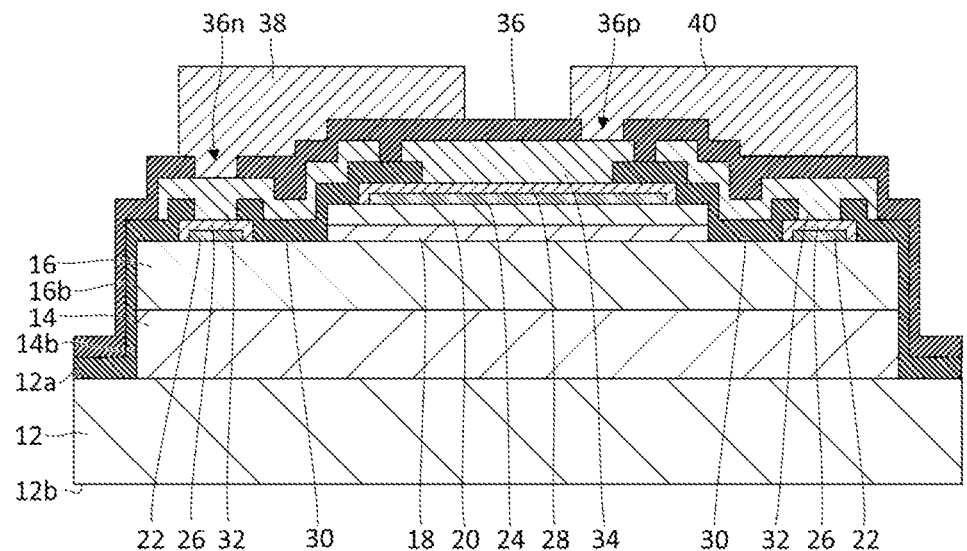
FIG. 9 schematically shows a step of manufacturing the semiconductor light-emitting element.

Subsequently, as shown in FIG. 9, the second insulating layer 36 is removed in part by dry-etching or the like to form the n-side second opening 36n and the p-side second opening 36p. The n-side second opening 36n and the p-side second opening 36p are provided to extend through the second insulating layer 36. The upper surface of the n-side second electrode 32 is exposed in the n-side second opening 36n, and the upper surface of the p-side second electrode 34 is exposed in the p-side second opening 36p.

Subsequently, as shown in FIG. 9, the n-side pad electrode 38 is formed on the second insulating layer 36 so as to block the n-side second opening 36n, and the p-side pad electrode 40 is formed on the second insulating layer 36 so as to block the p-side second opening 36p. The n-side pad electrode 38 and the p-side pad electrode 40 may be formed concurrently or formed separately. The n-side pad electrode 38 and the p-side pad electrode 40 can be formed by sputtering or EB deposition.

Figure 10:
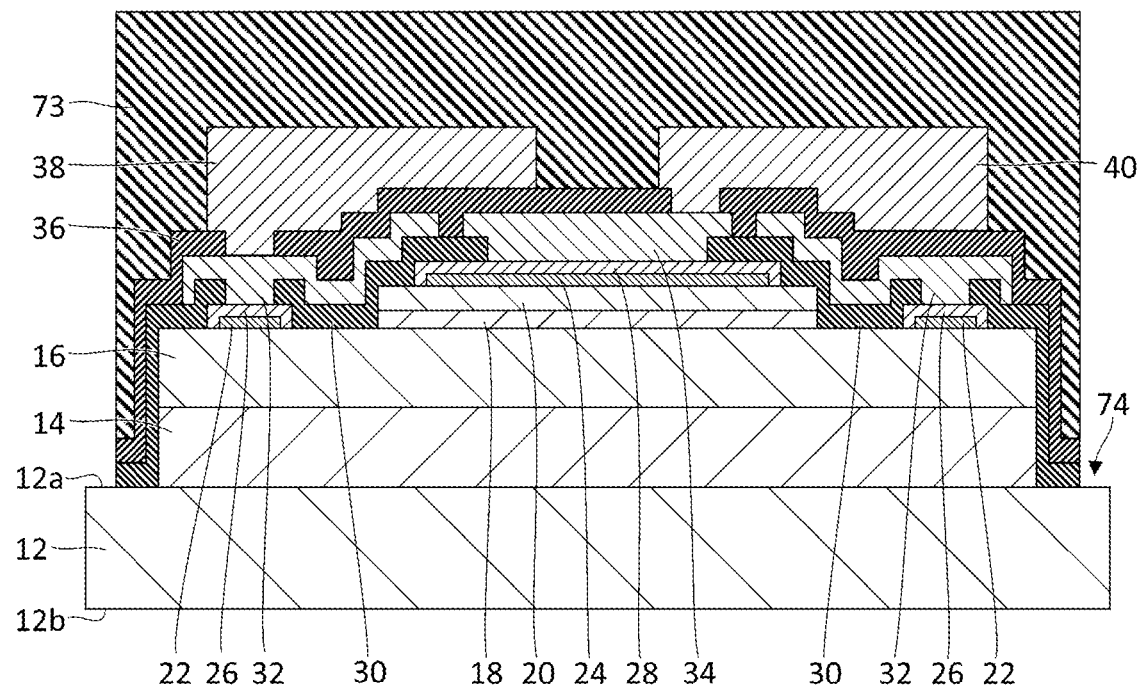
FIG. 10 schematically shows a step of manufacturing the semiconductor light-emitting element.

Subsequently, as shown in FIG. 10, a mask 73 is formed on the second insulating layer 36, the n-side pad electrode 38, and the p-side pad electrode 40 by using a publicly known lithographic technology. The mask 73 is formed in a range more extensive than a range in which the n-type semiconductor layer 16 is formed and is formed to exclude only an outer circumferential part 74 located outside the side surface 16b of the n-type semiconductor layer 16. After the mask 73 is formed, a region not overlapping the mask 73, i.e., the second insulating layer 36 and the first insulating layer 30 located in the outer circumferential part 74, is removed by dry-etching or the like to expose the first principal surface 12a of the substrate 12 in the outer circumferential part 74. The mask 73 is then removed, and the substrate 12 is cut into individual pieces in the outer circumferential part 74 in which the first insulating layer 30 and the second insulating layer 36 are removed, thereby completing the semiconductor light-emitting element 10.

Second Embodiment

Figure 11:
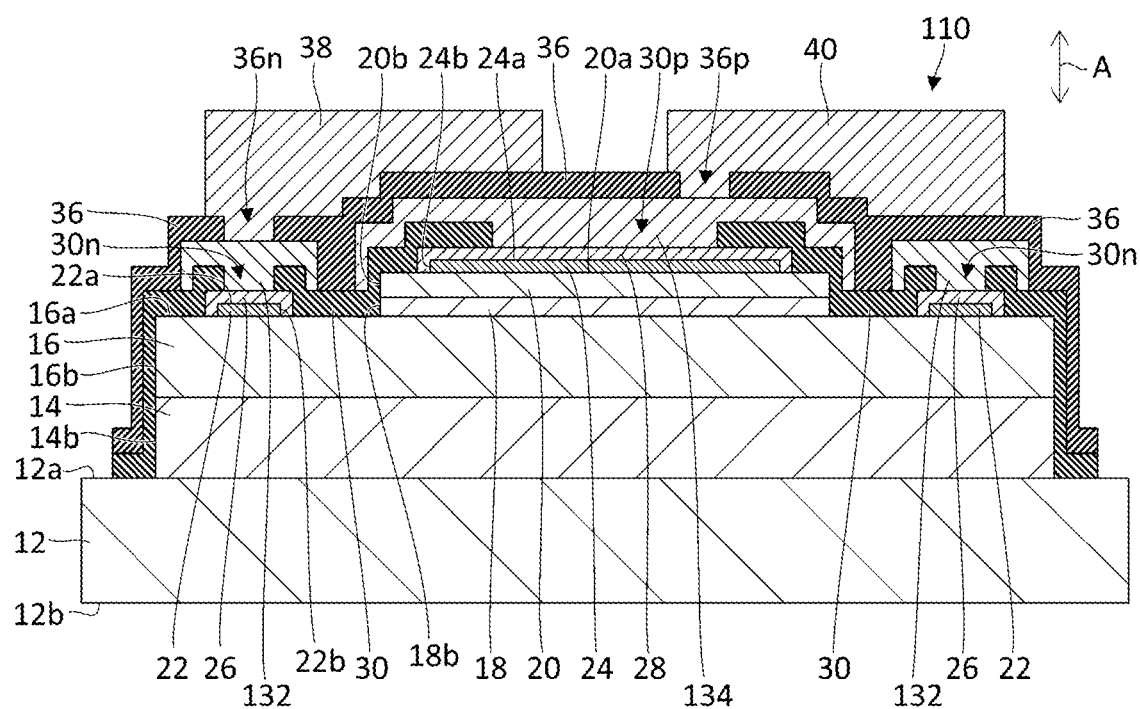
FIG. 11 is a cross sectional view schematically showing a configuration of a semiconductor light-emitting element according to the second embodiment.

FIG. 11 is a cross-sectional view schematically showing a configuration of a semiconductor light-emitting element 110 according to the second embodiment. The semiconductor light-emitting element 110 is configured like the semiconductor light-emitting element 10 according to the first embodiment except that the range in which a n-side second electrode 132 and a p-side second electrode 134 are formed differs from that of the first embodiment. The following description highlights the difference from the first embodiment. A description of common features is omitted as appropriate.

The semiconductor light-emitting element 110 includes the substrate 12, the base layer 14, the n-type semiconductor layer 16, the active layer 18, the p-type semiconductor layer 20, the n-side contact electrode 22, the p-side contact electrode 24, the n-side first electrode 26, the p-side first electrode 28, the first insulating layer 30, the n-side second electrode 132, the p-side second electrode 134, the second insulating layer 36, the n-side pad electrode 38, and the p-side pad electrode 40.

As in the first embodiment, the n-side second electrode 132 is provided on the first insulating layer 30 so as to block the n-side first opening 30n and is in contact with the n-side first electrode 26 in the n-side first opening 30n. The n-side second electrode 132 is provided in a range more extensive than a range in which the n-side first electrode 26 is formed. The n-side second electrode 132 is provided not to cover the side surface 18b of the active layer 18 and is provided not to overlap the active layer 18.

As in the first embodiment, the p-side second electrode 134 is provided on the first insulating layer 30 so as to block the p-side first opening 30p and is in contact with the p-side first electrode 28 in the p-side first opening 30p. The p-side second electrode 134 is provided in a range more extensive than a range in which the p-side first electrode 28 is formed. The p-side second electrode 134 is provided to cover the side surface 18b of the active layer 18.

The n-side second electrode 132 and the p-side second electrode 134 are comprised of the metal multilayer film 50 of FIG. 2. The thickness of the n-side second electrode 132 and the p-side second electrode 134 is equal to or more than 500 nm and equal to or less than 1500 nm and is, for example, equal to or more than 700 nm and equal to or less than 1200 nm. The thickness of the n-side second electrode 132 and the p-side second electrode 134 may be equal to the thickness of the first insulating layer 30 or may be larger than the thickness of the first insulating layer 30.

According to this embodiment, the same advantage as that of the first embodiment is realized. By causing the p-side second electrode 134 to cover the side surface 18b of the active layer 18, the deep ultraviolet light emitted from the side surface 18b of the active layer 18 and transmitted through the first insulating layer 30 can be reflected by the p-side second electrode 134, and the light extraction efficiency of the semiconductor light-emitting element 10 can be increased. Further, this enlarges the range in which the p-side second electrode 134 is formed and enhances the advantage of diffusing the current injected into the p-side contact electrode 24. Consequently, this inhibits the element life from being shortened due to current concentration and improves the reliability of the semiconductor light-emitting element 110.

Described above is an explanation based on an exemplary embodiment. The invention is not limited by the embodiments described above, and it will be understood by those skilled in the art that various design changes are possible and various modifications are possible and that such modifications are also within the scope of the present invention.

A description will now be given of some aspects of the present invention.

A first aspect of the present invention relates to a semiconductor light-emitting element including: an n-type semiconductor layer; an active layer provided on the n-type semiconductor layer and configured to emit deep ultraviolet light having a wavelength of 360 nm or shorter; a p-type semiconductor layer provided on the active layer; an n-side contact electrode in contact with an upper surface of the n-type semiconductor layer; a p-side contact electrode in contact with an upper surface of the p-type semiconductor layer; an n-side first electrode in contact with an upper surface and a side surface of the n-side contact electrode; a p-side first electrode in contact with an upper surface and a side surface of the p-side contact electrode; a first insulating layer that has an n-side first opening provided on the n-side first electrode, has a p-side first opening provided on the p-side first electrode, covers the n-side first electrode outside the n-side first opening, covers the p-side first electrode outside the p-side first opening, and is in contact with the n-type semiconductor layer, the active layer, the p-type semiconductor layer, the n-side first electrode, and the p-side first electrode; an n-side second electrode provided on the first insulating layer and being in contact with the n-side first electrode in the n-side first opening; a p-side second electrode provided on the first insulating layer and being in contact with the p-side first electrode in the p-side first opening; a second insulating layer that has an n-side second opening provided on the n-side second electrode, has a p-side second opening provided on the p-side second electrode, covers the n-side second electrode outside the n-side second opening, covers the p-side second electrode outside the p-side second opening, and is in contact with the first insulating layer, the n-side second electrode, and the p-side second electrode; an n-side pad electrode provided on the second insulating layer and being in contact with the n-side second electrode in the n-side second opening; and a p-side pad electrode provided on the second insulating layer and being in contact with the p-side second electrode in the p-side second opening. According to the first aspect, it is possible to cause a current to flow evenly over the entirety of the n-side contact electrode and enhance the coverage performance of the first insulating layer, by providing the n-side first electrode in contact with the upper surface and the side surface of the n-side contact electrode. Similarly, it is possible to cause a current to flow evenly over the entirety of the p-side contact electrode and enhance the coverage performance of the first insulating layer, by providing the p-side first electrode in contact with the upper surface and the side surface of the p-side contact electrode.

A second aspect of the present invention relates to the semiconductor light-emitting element according to the first aspect, wherein each of the first insulating layer and the second insulating layer is made of a single dielectric material, and each of the n-side first electrode, the p-side first electrode, the n-side second electrode, and the p-side second electrode is a metal multilayer film in which a plurality of metal layers made of different metal materials are stacked. According to the second aspect, by forming the n-side first electrode, the p-side first electrode, the n-side second electrode, and the p-side second electrode by a metal multilayer film, it is possible to increase the thickness of these electrodes and enhance the function of diffusing the current. Further, it is possible to inhibit exfoliation of the electrodes more successfully than when a single metal material is used to form a thick layer, by using a metal multilayer film. Further, it is possible to simplify the manufacturing steps, by configuring the first insulating layer and the second insulating layer to be made of a single dielectric material.

A third aspect relates to the semiconductor light-emitting element according to the second aspect, wherein the metal multilayer film includes a plurality of first metal layers made of a first metal material and a plurality of second metal layers made of a second metal material and stacked alternately with the first metal layers, the topmost layer of the plurality of second metal layers is provided above the plurality of first metal layers, variation in thickness of the plurality of first metal layers is less than 10%, variation in thickness of the plurality of second metal layers except for the topmost layer is less than 10%, and a thickness of the topmost layer is larger than a thickness of the plurality of second metal layers except for the topmost layer by 10% or larger. According to the third aspect, it is possible to inhibit exfoliation of the layers, by configuring the plurality of first metal layers to have substantially the equal thickness and configuring the plurality of second metal layers except for the topmost layer to have substantially the equal thickness. Further, it is possible to prevent the first metal material from being mixed in the neighborhood of the upper surface of the topmost second metal layer and increase the quality of the metal multilayer film, by configuring the topmost second metal layer to have a larger thickness.

A fourth aspect of the present invention relates to the semiconductor light-emitting element according to the third aspect, wherein the metal multilayer film further includes a third metal layer provided below the plurality of first metal layers and the plurality of second metal layers and made of a third metal material having a reflectivity for the deep ultraviolet light higher than reflectivity of the first metal material and the second metal material. According to the fourth aspect, it is possible to configure the metal multilayer film as a reflection electrode and increase the light extraction efficiency of the semiconductor light-emitting element, by providing the third metal layer having a high reflectivity for deep ultraviolet light at the bottom of the metal multilayer film.

A fifth aspect of the present invention relates to the semiconductor light-emitting element according to the third aspect, wherein the metal multilayer film further includes a fourth metal layer provided above the plurality of first metal layers and the plurality of second metal layers and made of a fourth metal material having a higher conductivity than conductivity of the first metal material and the second metal material. According to the fifth aspect, it is possible to diffuse the current in the horizontal direction at the top of the metal multilayer film and enhance the advantage of diffusing the current in the metal multilayer film, by providing the fourth metal layer having a high conductivity at the top of the metal multilayer film.

A sixth aspect of the present invention relates to the semiconductor light-emitting element according to any one of the first through fifth aspects, wherein a thickness of the first insulating layer is equal to or larger than a thickness of the n-side first electrode and the p-side first electrode, and a thickness of the second insulating layer is equal to or larger than a thickness of the n-side second electrode and the p-side second electrode. According to the sixth aspect, it is possible to enhance the coverage performance of the insulating layers and realize improvement in the humidity resistance and leakage reduction in the semiconductor light-emitting element, by providing the insulating layers to have a thickness equal to or larger than the thickness of the electrodes covered by the insulating layers.

A seventh aspect of the present invention relates to the semiconductor light-emitting element according to any one of the first through sixth aspects, wherein the n-side second electrode covers a side surface of the active layer. According to the seventh aspect, it is possible to cause the deep ultraviolet light emitted from the side surface of the active layer to be reflected by the n-side second electrode and increase the light extraction efficiency, by providing the n-side second electrode to cover the side surface of the active layer. Further, it is possible to enlarge the range in which the n-side second electrode is formed and enhance the advantage of diffusing the current in the n-side contact electrode, by providing the n-side second electrode to cover the side surface of the active layer.

An eighth aspect of the present invention relates to the semiconductor light-emitting element according to any one of the first through sixth aspects, wherein the p-side second electrode covers a side surface of the active layer. According to the eighth aspect, it is possible to cause the deep ultraviolet light emitted from the side surface of the active layer to be reflected by the p-side second electrode and increase the light extraction efficiency, by providing the p-side second electrode to cover the side surface of the active layer. Further, it is possible to enlarge the range in which the p-side second electrode is formed and enhance the advantage of diffusing the current in the p-side contact electrode, by providing the p-side second electrode to cover the side surface of the active layer.

What is claimed is:

1. A semiconductor light-emitting element comprising:
    an n-type semiconductor layer;
    an active layer provided on the n-type semiconductor layer and configured to emit deep ultraviolet light having a wavelength of 360 nm or shorter;
    a p-type semiconductor layer provided on the active layer;
    an n-side contact electrode in contact with an upper surface of the n-type semiconductor layer;
    a p-side contact electrode in contact with an upper surface of the p-type semiconductor layer;
    an n-side first electrode in contact with an upper surface and a side surface of the n-side contact electrode;
    a p-side first electrode in contact with an upper surface and a side surface of the p-side contact electrode;
    a first insulating layer that has an n-side first opening provided on the n-side first electrode, has a p-side first opening provided on the p-side first electrode, covers the n-side first electrode outside the n-side first opening, covers the p-side first electrode outside the p-side first opening, and is in contact with the n-type semiconductor layer, the active layer, the p-type semiconductor layer, the n-side first electrode, and the p-side first electrode;
    an n-side second electrode provided on the first insulating layer, overlapping the first insulating layer and being in contact with the n-side first electrode in the n-side first opening;
    a p-side second electrode provided on the first insulating layer, overlapping the first insulating layer and being in contact with the p-side first electrode in the p-side first opening;
    a second insulating layer that has an n-side second opening provided on the n-side second electrode, has a p-side second opening provided on the p-side second electrode, covers the n-side second electrode outside the n-side second opening, covers the p-side second electrode outside the p-side second opening, and is in contact with the first insulating layer, the n-side second electrode, and the p-side second electrode;
    an n-side pad electrode provided on the second insulating layer, overlapping the second insulating layer and being in contact with the n-side second electrode in the n-side second opening; and
    a p-side pad electrode provided on the second insulating layer, overlapping the second insulating layer and being in contact with the p-side second electrode in the p-side second opening,
    wherein the first insulating layer comprises a portion interposed between the n-side first electrode and the n-side second electrode, and a portion interposed between the p-side first electrode and the p-side second electrode, and
    wherein the p-side second electrode is provided in an area surrounding the p-side first electrode.

2. The semiconductor light-emitting element according to claim 1, wherein
    each of the first insulating layer and the second insulating layer is made of a single dielectric material, and
    each of the n-side first electrode, the p-side first electrode, the n-side second electrode, and the p-side second electrode is a metal multilayer film in which a plurality of metal layers made of different metal materials are stacked.

3. The semiconductor light-emitting element according to claim 2, wherein
the metal multilayer film includes a plurality of first metal layers made of a first metal material and a plurality of second metal layers made of a second metal material and stacked alternately with the first metal layers,
the topmost layer of the plurality of second metal layers is provided above the plurality of first metal layers,
variation in thickness of the plurality of first metal layers is less than 10%,
variation in thickness of the plurality of second metal layers except for the topmost layer is less than 10%, and
a thickness of the topmost layer is larger than a thickness of the plurality of second metal layers except for the topmost layer by 10% or larger.

4. The semiconductor light-emitting element according to claim 3, wherein
the metal multilayer film further includes a third metal layer provided below the plurality of first metal layers and the plurality of second metal layers and made of a third metal material having a reflectivity for the deep ultraviolet light higher than reflectivity of the first metal material and the second metal material.

5. The semiconductor light-emitting element according to claim 3, wherein
the metal multilayer film further includes a fourth metal layer provided above the plurality of first metal layers and the plurality of second metal layers and made of a fourth metal material having a higher conductivity than conductivity of the first metal material and the second metal material.

6. The semiconductor light-emitting element according to claim 1, wherein
a thickness of the first insulating layer is equal to or larger than a thickness of the n-side first electrode and the p-side first electrode, and a thickness of the second insulating layer is equal to or larger than a thickness of the n-side second electrode and the p-side second electrode.

7. The semiconductor light-emitting element according to claim 1, wherein
the p-side second electrode covers a side surface of the active layer.

8. The semiconductor light-emitting element according to claim 1, wherein the n-side second electrode is provided in an area more extensive than a range in which the n-side first electrode is formed.

* * * * *